United States Patent
Wang et al.

(10) Patent No.: US 11,043,650 B2
(45) Date of Patent: Jun. 22, 2021

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Wei Wang, Hubei (CN); Qing Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/609,223

(22) PCT Filed: Jul. 9, 2019

(86) PCT No.: PCT/CN2019/095217
§ 371 (c)(1),
(2) Date: Oct. 29, 2019

(87) PCT Pub. No.: WO2020/237782
PCT Pub. Date: Dec. 3, 2020

(65) Prior Publication Data
US 2020/0381651 A1    Dec. 3, 2020

(30) Foreign Application Priority Data

May 28, 2019 (CN) .......................... 201910452188.6

(51) Int. Cl.
*H01L 51/52*    (2006.01)
*H01L 27/32*    (2006.01)
*G06K 9/00*    (2006.01)

(52) U.S. Cl.
CPC ...... *H01L 51/5218* (2013.01); *H01L 27/3227* (2013.01); *H01L 27/3246* (2013.01); *G06K 9/00013* (2013.01)

(58) Field of Classification Search
CPC .................................................. H01L 51/5218
See application file for complete search history.

(56) References Cited

U.S. PATENT DOCUMENTS

| | | | |
|---|---|---|---|
| 9,553,156 B2 * | 1/2017 | Kim | H01L 51/5253 |
| 2008/0128686 A1 * | 6/2008 | Kwon | H01L 51/5218 |
| | | | 257/40 |
| 2008/0180024 A1 * | 7/2008 | Kwon | H01L 27/3244 |
| | | | 313/504 |

(Continued)

*Primary Examiner* — Michelle Mandala
*Assistant Examiner* — Jordan M Klein
(74) *Attorney, Agent, or Firm* — Mark M. Friedman

(57) ABSTRACT

A display panel and a display device are disclosed. The display panel defines a basic display area and a light transmissive display area connected to the basic display area. The light transmissive display area includes an anode layer, a pixel defining layer, a light-emitting functional layer, and a cathode all sequentially laminated to each other. The anode layer includes a first transparent conductive layer, a metal reflective layer, and a second transparent conductive layer. The metal reflective layer is disposed on the first transparent conductive layer and corresponding to the light-emitting elements. The display device includes the display panel.

10 Claims, 3 Drawing Sheets

(56) References Cited

U.S. PATENT DOCUMENTS

| | | | |
|---|---|---|---|
| 2009/0078946 A1* | 3/2009 | Jeong | H01L 51/5206 257/94 |
| 2016/0020422 A1* | 1/2016 | Kim | H01L 29/45 257/40 |
| 2016/0351651 A1* | 12/2016 | Jang | H01L 27/3276 |
| 2016/0351652 A1* | 12/2016 | Kim | H01L 27/3248 |
| 2017/0062755 A1* | 3/2017 | Im | H01L 51/5228 |
| 2018/0102498 A1* | 4/2018 | Shin | G09G 3/3233 |
| 2018/0182989 A1* | 6/2018 | Paek | H01L 27/3246 |
| 2020/0168832 A1* | 5/2020 | Shin | H01L 51/5218 |

* cited by examiner

DISPLAY PANEL AND DISPLAY DEVICE

BACKGROUND OF INVENTION

1. Field of Invention

The present invention relates to a technical field of displays, and particularly to, a display panel and a display device.

2. Related Art

With increasing popularity of mobile devices, high-screen ratio screens have become the future development trend of electronic devices such as mobile phones and tablets due to their ability to offer users a better visual experience. Mobile electronic terminals, especially mobile phones, pursue dual advantages of portability and large-screen display, requiring electronic products to have a highest possible screen ratio. However, in peripheries of mobile phone display screens, it is often necessary to reserve positions for a variety of optical electronic components (e.g. handset, front camera, infrared sensor, etc.), thereby limiting reduction of screen frames, and it is difficult to achieve a higher screen ratio.

In order to minimize areas of non-display areas around display screens, a series of technology for built-in components under-screen has been developed, such as screen fingerprint recognition, under-screen sensing and so on. However, development of under-screen camera technology has faced many problems. Because camera components are placed under display screens, external light needs to penetrate the display screens to be received by the camera components. Therefore, transmittance of the display screens to external light becomes a key factor affecting imaging quality of imaging components, wherein an important factor affecting the transmittance of the display screens is blocking of external light by light-emitting elements (pixel structure).

As shown in FIG. 1, FIG. 1 is a conventional pixel structure and schematically shows a reflection of external light by the conventional pixel structure. A current pixel structure 200 includes an anode 231, a pixel defining layer 232, a light emitting function layer 233, and a cathode 234. The anode 231 includes a first transparent conductive layer 2311, a metal reflective layer 2312, and a second transparent conductive layer 2313. When a screen is displayed, the metal reflective layer 2312 can effectively reflect the light of the light-emitting function layer 233, thereby improving brightness of the screen. The second transparent conductive layer 2313 serves as a modified layer of the anode 231, which can improve luminous efficiency of organic pixels. On the other hand, when a camera under the screen operates, a large amount of external light is reflected by the anode 231, which is disadvantageous for imaging, and a path of external light reflected by the anode 231 is shown in a direction of an arrow shown in FIG. 1.

Therefore, how to obtain a higher transmittance of external light source while ensuring a higher light output efficiency of a screen becomes a contradiction of the screen camera technology.

As a result, it is imperative to provide a novel display panel and a display device to overcome problems existing in current technology.

SUMMARY OF INVENTION

An object of the present invention is to provide a display panel and a display device, capable of ensuring that a screen shows high light output efficiency and concurrently obtaining a high transmittance of an external light source, thereby to facilitate imaging by a camera under the screen.

In order to overcome the above-mentioned problem, the present invention provides a display panel, defining a basic display area and a light transmissive display area connected to the basic display area, wherein the light transmissive display area includes an anode layer, a pixel defining layer, a light-emitting functional layer, and a cathode all laminated to each other. Specifically, the pixel defining layer is disposed on the anode layer. The light-emitting functional layer is disposed on the pixel defining layer and includes a plurality of light-emitting elements. The cathode is disposed on the light-emitting functional layer. The anode layer includes a first transparent conductive layer, a metal reflective layer, and a second transparent conductive layer all laminated to each other. Specifically, the metal reflective layer is disposed on the first transparent conductive layer and corresponding to the light-emitting elements. The second transparent conductive layer is disposed on the metal reflective layer.

Further, the first transparent conductive layer is disposed corresponding to the light-emitting elements.

Further, the light transmissive display area defines a plurality of light-emitting areas and a plurality of non-display areas, wherein each of the light-emitting areas is surrounded by one of the non-display areas and is disposed corresponding to the light-emitting element, and wherein each of the light-emitting areas comprises a first light-emitting area and a second light-emitting area surrounding the first light-emitting area, and the metal reflective layer is disposed corresponding to the first light-emitting area.

Further, the metal reflective layer is adapted to a shape and a size of the first transparent conductive layer.

Further, the first transparent conductive layer is disposed corresponding to the first light-emitting area.

Further, the display panel further comprises a third transparent conductive layer disposed on the metal reflective layer, wherein the third transparent conductive layer is adapted to a shape and a size of the metal reflective layer or the first transparent conductive layer.

Further, the light transmissive display area is circular, triangular, rectangular, or polygonal in shape.

Further, the display panel further comprises a sensor disposed corresponding to the light transmissive display area.

Further, the sensor comprises one or a combination of a camera sensor, a flash light, a light sensor, a breathing light sensor, a distance sensor, a fingerprint scanner sensor, a microphone sensor, or a transparent antenna sensor.

The present invention further provides a display device, comprising the display panel as described above.

The present invention has advantageous effects as follows: providing the display panel and the display device configured to reduce an area taken up by the metal reflective layer and to set the metal reflective layer only on a central position of an area corresponding to light emitting units, and thus can ensure that a screen shows high light output efficiency and concurrently obtains a high transmittance of an external light source, thereby to facilitate imaging by a camera under the screen.

DESCRIPTION OF PREFERRED EMBODIMENTS

Figure 1:
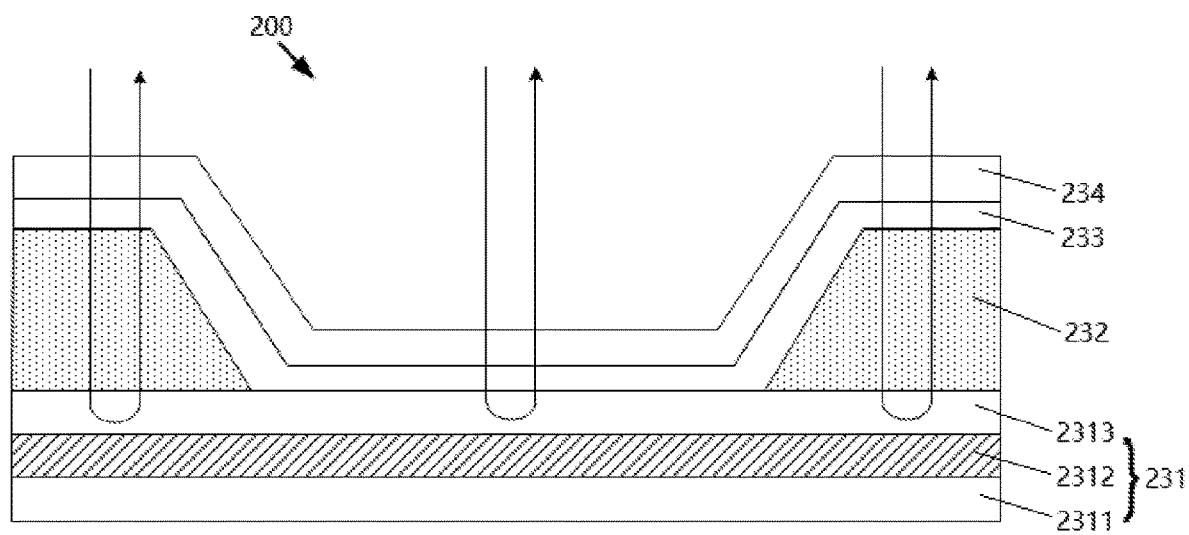
FIG. 1 is a schematic structural view of a conventional display panel.
Figure 2:
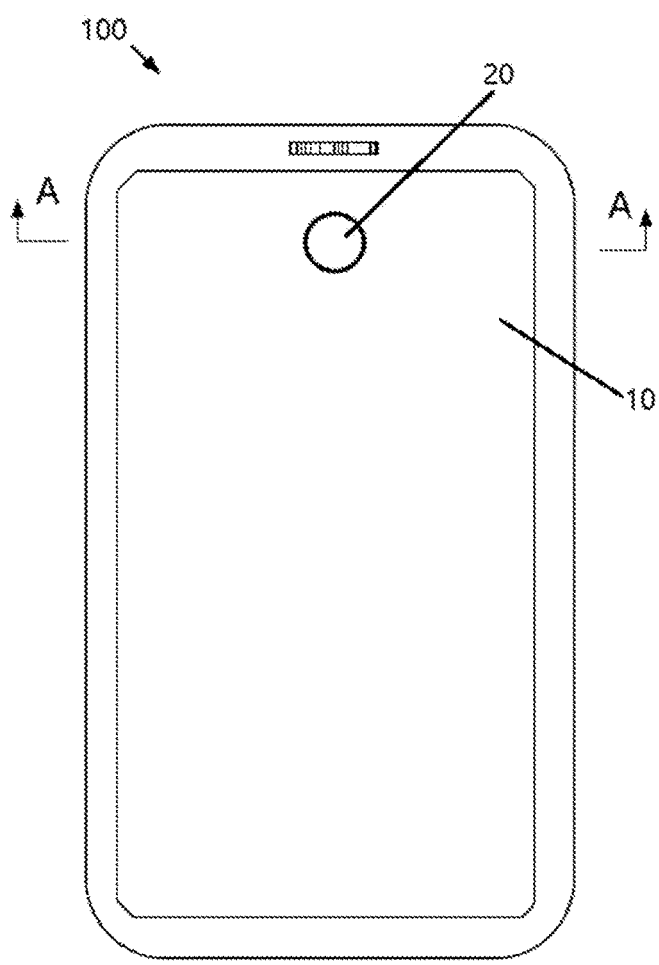
FIG. 2 is a schematic plan view showing a structure of a display panel of a first embodiment of the present invention.
Figure 3:
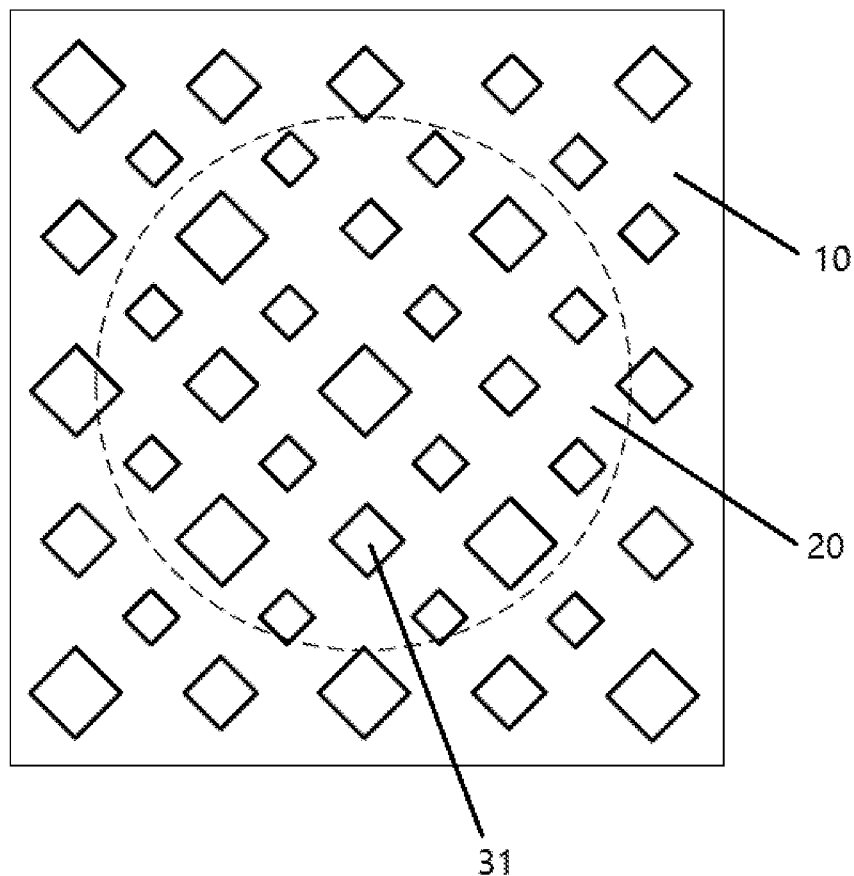
FIG. 3 is a partial schematic structural view of the display panel of the first embodiment of the present invention, mainly showing a distributed pattern of light-emitting elements.
Figure 4:
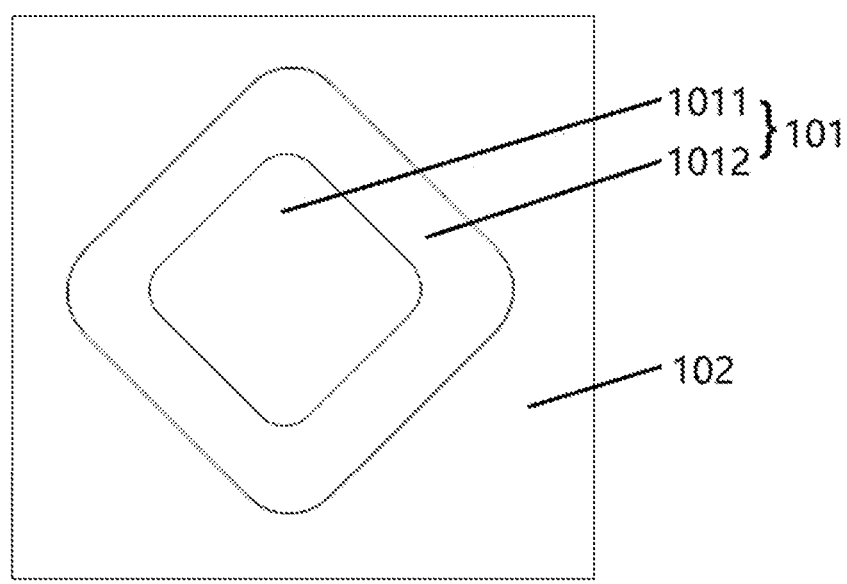
FIG. 4 is an area division view of one of the light-emitting elements in a display area shown in FIG. 3.

In the present invention, unless otherwise expressly specified or limited, the first feature being "on" or "lower" the second feature may include direct contact of the first and the second features and may also include that the first and the second features are not in direct contact, but in contact by the additional features therebetween. Also, the first feature being "on", "above", "upper" the second feature may include that the first feature is obliquely upward, directly above the second feature, or simply represent that a level of the first feature is higher than that of the second feature. The first feature being "beneath", "below" and "lower" the second feature may include that the first feature is obliquely downward and right below the second feature, or simply represent that a level of the first feature is less than that of the second feature.

Throughout the specification, the word "comprises" or "includes" is used to describe the presence of features and/or components described in the specification, and does not exclude the presence of one or more other features and/or one or more other components. It will be understood that when a layer, an area, a component or the like is referred to as being "on" another layer, another area, or another component, the layer, area, component, etc. may be directly on another layer, another area or another component, or may also be presented in intermediate layers, intermediate zones, or intermediate components.

In the present invention, the same or corresponding components are denoted by the same reference numerals regardless of the figure number. Throughout the specification, when the terms "first", "second", etc. are used to describe various components, these components are not necessarily limited to the above. The above wording is only used to distinguish one component from another.

Embodiment 1

Please refer to FIGS. 2-5. In a first embodiment of the present invention, the present invention provides a display panel 100, defining a conventional basic display area 10 and a light transmissive display area 20 connected to the basic display area 10, wherein the light transmissive display area 20 includes an anode layer 1, a pixel defining layer 2, a light-emitting functional layer 3, and a cathode 4 all laminated to each other. Specifically, the pixel defining layer 2 is disposed on the anode layer 1. The light-emitting functional layer 3 is disposed on the pixel defining layer 2 and includes a plurality of light-emitting elements 31. The cathode 4 is disposed on the light-emitting functional layer 3.

Preferably, the light-emitting elements 31 of this embodiment may be organic light-emitting diode (OLED) components, and each of OLED units is configured to realize self-illumination after corresponding current is supplied.

Preferably, the light-emitting elements 31 of this embodiment may be a liquid crystal display (LCD) module. The LCD module is encapsulated with a liquid crystal layer. After a voltage is supplied to the liquid crystal layer, alignment directions of liquid crystal molecules can be changed, so that light projected by a backlight source cooperatively operates with internal components of the LCD module to form an image in a display area.

In this embodiment, the light transmissive display area 20 is circular, triangular, rectangular, or polygonal in shape. A specific shape of the light transmissive display area 20 is variable subject to actual requirements.

Figure 5:
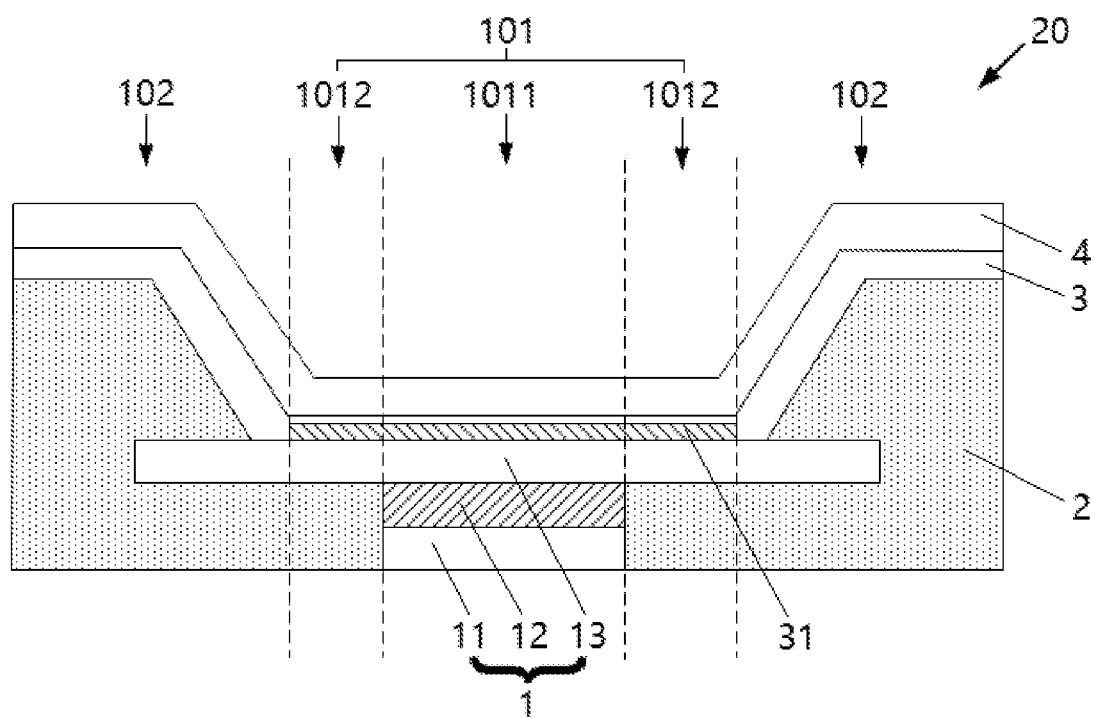
FIG. 5 is a partial schematic cross-sectional view taken along line A-A of FIG. 2.

Please refer to FIG. 5. In this embodiment, the display panel 100 further includes a sensor (not shown) disposed corresponding to the light transmissive display area 20. The sensor includes one or a combination of a camera sensor, a flash light, a light sensor, a breathing light sensor, a distance sensor, a fingerprint scanner sensor, a microphone sensor, or a transparent antenna sensor.

In this embodiment, the anode layer 1 includes a first transparent conductive layer 11, a metal reflective layer 12, and a second transparent conductive layer 13. Specifically, the metal reflective layer 12 is disposed on the first transparent conductive layer 11 and corresponding to the light-emitting elements 31. The second transparent conductive layer 13 is disposed on the metal reflective layer 12.

In this embodiment, the first transparent conductive layer 11 is disposed corresponding to the light-emitting elements 31. Please refer to FIGS. 4 and 5. In this embodiment, the light transmissive display area 20 defines a plurality of light-emitting areas 101 and a plurality of non-display areas 102. Each of the light-emitting areas 101 is surrounded by one of the non-display areas 102 and is disposed corresponding to the light-emitting element 31. The anode layer 1 is disposed corresponding to the light-emitting areas 101. More specifically, each of the light-emitting areas 101 includes a first light-emitting area 1011 and a second light-emitting area 1012 surrounding the first light-emitting area 1011. The metal reflective layer 12 is disposed corresponding to the first light-emitting area 1011. That is, the metal reflective layer 12 has a layout pattern same as that of the first light-emitting area 1011, and the anode layer 1 has a layout pattern same as or corresponding to that of the light-emitting elements 31.

In this embodiment, the metal reflective layer 12 is adapted to a shape and a size of the first transparent conductive layer 11. That is, the metal reflective layer 12 has a layout pattern same as that of the first transparent conductive layer 11.

In this embodiment, the first transparent conductive layer 11 is disposed corresponding to the first light-emitting area 1011. That is, the first transparent conductive layer 11 has a layout pattern same as that of the first light-emitting area 1011.

Embodiment 2

Figure 6:
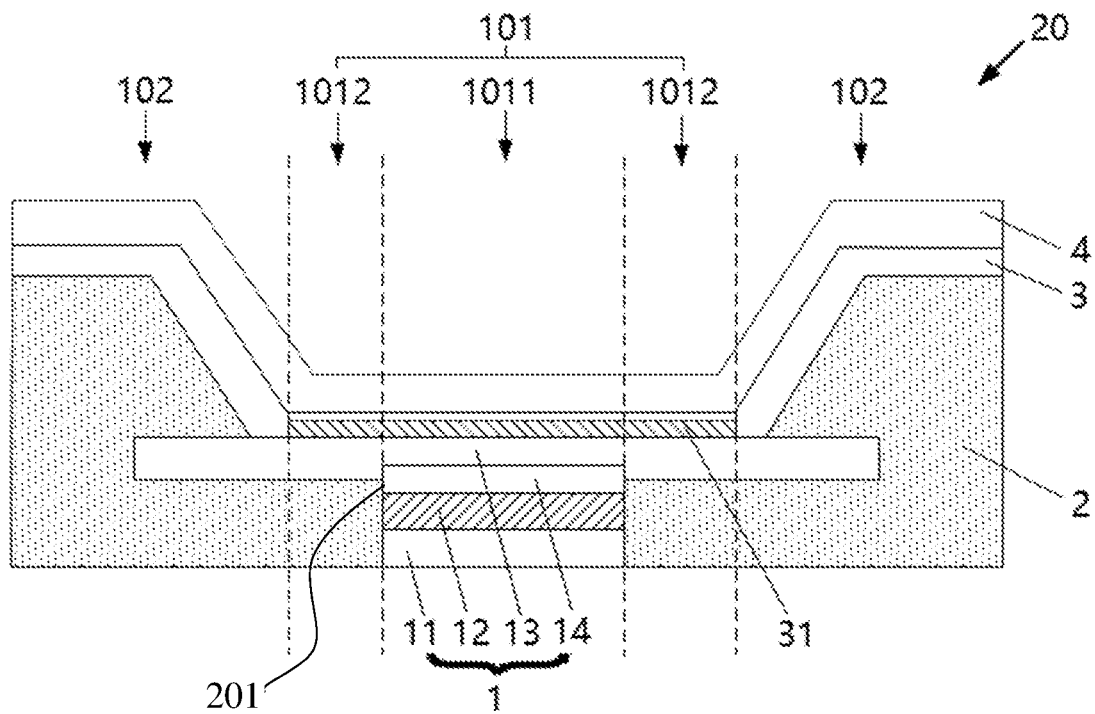
FIG. 6 is a schematic structure view of a display panel of a second embodiment of the present invention.

Please refer to FIG. 6. In the second embodiment, the second embodiment differs from the first embodiment in that the anode layer 1 of the display panel 100 further includes a third transparent conductive layer 14. The third transparent conductive layer 14 is disposed on the metal reflective layer 12, that is, the third transparent conductive layer 14 is disposed between the metal reflective layer 12 and the second transparent conductive layer 13. The third transparent conductive layer 14 is adapted to a shape and a size of the metal reflective layer 12 or the first transparent conductive layer 11.

A purpose of providing the third transparent conductive layer 14 is as follows: when a sum of heights of the first transparent conductive layer 11 and the metal reflective layer 12 is less than a depth of a via hole of the pixel defining layer 2 for accommodating both the first transparent conductive layer 11 and the metal reflective layer 12, insulation caused by the pixel defining layer 2 covering the metal reflective layer 12 can be prevented by adding the third transparent conductive layer 14. Or, in manufacturing processes, a via hole 201 is formed in the pixel defining layer 2 corresponding to the first light-emitting area 1011, and the first transparent conductive layer 11, the metal reflective layer 12, and the third transparent conductive layer 14 are sequentially fabricated in the via hole. By adjusting thickness of the third transparent conductive layer 14, an overall height thereof is higher than the via hole, thereby preventing the pixel defining layer 2 from covering the metal reflective layer 12 to cause insulation.

Based on the same inventive concept, an embodiment of the present disclosure provides a display device. The display device includes the display panel 100 provided by the above embodiment. The display device in the embodiment of the present disclosure may be any product or component having a display function, such as mobile phones, tablets, televisions, displays, notebook computers, digital photo frames, navigators, and the like.

A working principle of the display device provided in this embodiment is consistent with a working principle of the embodiment of the display panel 100. For the specific structural relationship and working principle, please refer to the foregoing embodiment of the display panel 100, and details are not described herein again.

The present invention has advantageous effects as follows: providing the display panel and the display device configured to reduce an area taken up by the metal reflective layer and to set the metal reflective layer only on a central position of an area corresponding to light emitting units, and thus can ensure that a screen shows high light output efficiency and concurrently obtains a high transmittance of an external light source, thereby to facilitate imaging by a camera under the screen.

It should be noted that, for the sake of clarity, only the structure for explaining the technical solution is shown in the drawings of the present disclosure; in actual products, additions, deletions, or modifications may be made on the basis of the drawings of the present disclosure to the possible extent without affecting the implementation of the technical solutions. The above description is only the preferred embodiment of the present disclosure, and is not intended to limit the disclosure. Any modifications, equivalent substitutions, improvements, etc., which are within the principles of the present disclosure, should be included in the scope of the present disclosure.

The above description is only the preferred embodiment of the present invention, and it is noted that those skilled in the art without departing from the scope of the present invention may make various changes or modifications, and thus the scope of the present invention should be after the appended claims and their equivalents.

What is claimed is:

1. A display panel, defining a basic display area and a light transmissive display area connected to the basic display area, wherein the light transmissive display area comprises:
an anode layer;
a pixel defining layer disposed on the anode layer;
a light-emitting functional layer disposed on the pixel defining layer and comprising a plurality of light-emitting elements; and
a cathode disposed on the light-emitting functional layer;
wherein the anode layer comprises:
a first transparent conductive layer;
a metal reflective layer disposed on the first transparent conductive layer and corresponding to the light-emitting elements;
a second transparent conductive layer disposed on the metal reflective layer; and
a third transparent conductive layer sandwiched between the metal reflective layer and the second transparent conductive layer;
wherein a via hole is formed in the pixel defining layer and extends through part of the second transparent conductive layer, so that the first transparent conductive layer, the metal reflective layer, and the third transparent conductive layer are disposed in the via hole in a stack arrangement of which part of the third transparent conductive layer is situated in the part of the second transparent conductive layer and another part of the third transparent conductive layer is situated in the pixel defining layer.

2. The display panel of claim 1, wherein the first transparent conductive layer is disposed corresponding to the light-emitting elements.

3. The display panel of claim 1, wherein the light transmissive display area defines a plurality of light-emitting areas and a plurality of non-display areas, wherein each of the light-emitting areas is surrounded by one of the non-display areas and is disposed corresponding to the light-emitting element, and wherein each of the light-emitting areas comprises a first light-emitting area and a second light-emitting area surrounding the first light-emitting area, and the metal reflective layer is disposed corresponding to the first light-emitting area.

4. The display panel of claim 3, wherein the metal reflective layer is adapted to a shape and a size of the first transparent conductive layer.

5. The display panel of claim 3, wherein the first transparent conductive layer is disposed corresponding to the first light-emitting area.

6. The display panel of claim 1, wherein the third transparent conductive layer is adapted to a shape and a size of the metal reflective layer or the first transparent conductive layer.

7. The display panel of claim 1, wherein the light transmissive display area is circular, triangular, rectangular, or polygonal in shape.

8. The display panel of claim 1, further comprising a sensor disposed corresponding to the light transmissive display area.

9. The display panel of claim 8, wherein the sensor comprises one or a combination of a camera sensor, a flash light, a light sensor, a breathing light sensor, a distance sensor, a fingerprint scanner sensor, a microphone sensor, or a transparent antenna sensor.

10. A display device, comprising the display panel of claim 1.

* * * * *